United States Patent [19]

Seidel et al.

[11] Patent Number: 5,080,597

[45] Date of Patent: Jan. 14, 1992

[54] GROUNDING MECHANISM

[75] Inventors: Peter Seidel, Groebenzell; Karl Zell, Niederpoecking, both of Fed. Rep. of Germany

[73] Assignee: Siemens Aktiengesellschaft, Munich, Fed. Rep. of Germany

[21] Appl. No.: 697,003

[22] Filed: May 8, 1991

[30] Foreign Application Priority Data

May 16, 1990 [EP] European Pat. Off. ......... 90109256.9

[51] Int. Cl.⁵ .............................................. H01R 4/66
[52] U.S. Cl. ...................................... 439/108; 439/95
[58] Field of Search ................. 439/78, 84, 95, 98, 439/108, 607, 609

[56] References Cited

U.S. PATENT DOCUMENTS

| | | | |
|---|---|---|---|
| 4,632,476 | 12/1986 | Schell | 439/95 |
| 4,659,155 | 4/1987 | Walkup et al. | 439/108 |
| 4,889,959 | 12/1989 | Taylor et al. | 439/95 X |

FOREIGN PATENT DOCUMENTS

0203404A3 12/1986 European Pat. Off.
0203404A2 12/1986 European Pat. Off.
8911590 1/1990 Fed. Rep. of Germany.
879445 2/1943 France.

Primary Examiner—Eugene F. Desmond
Attorney, Agent, or Firm—Hill, Van Santen, Steadman & Simpson

[57] ABSTRACT

Grounding mechanism for the electrical connection of shieldings of multi-pole plugs to the ground potential layer of a printed circuit board having a plurality of perpendicularly extending contact blades. A punched strip is provided with transverse slots, is bent around its longitudinal axis and has two edge regions, whereby outwardly arced spring regions of the punched strip proceeding parallel to the transverse slots are respectively arranged between the longitudinal axis and one of the edge regions, whereby webs having recesses are arranged at prescribed intervals from one another in a first edge region and clearances aligning with these webs are provided in a second edge region, and whereby the edge regions are bent pointing toward one another. In an assembled configuration, the punched strip is pressed together to such an extent that the webs of the first edge region penetrate through the clearances of the second edge region such that the recesses together with the clearances respectively form receptacle openings for the contact blades.

5 Claims, 2 Drawing Sheets

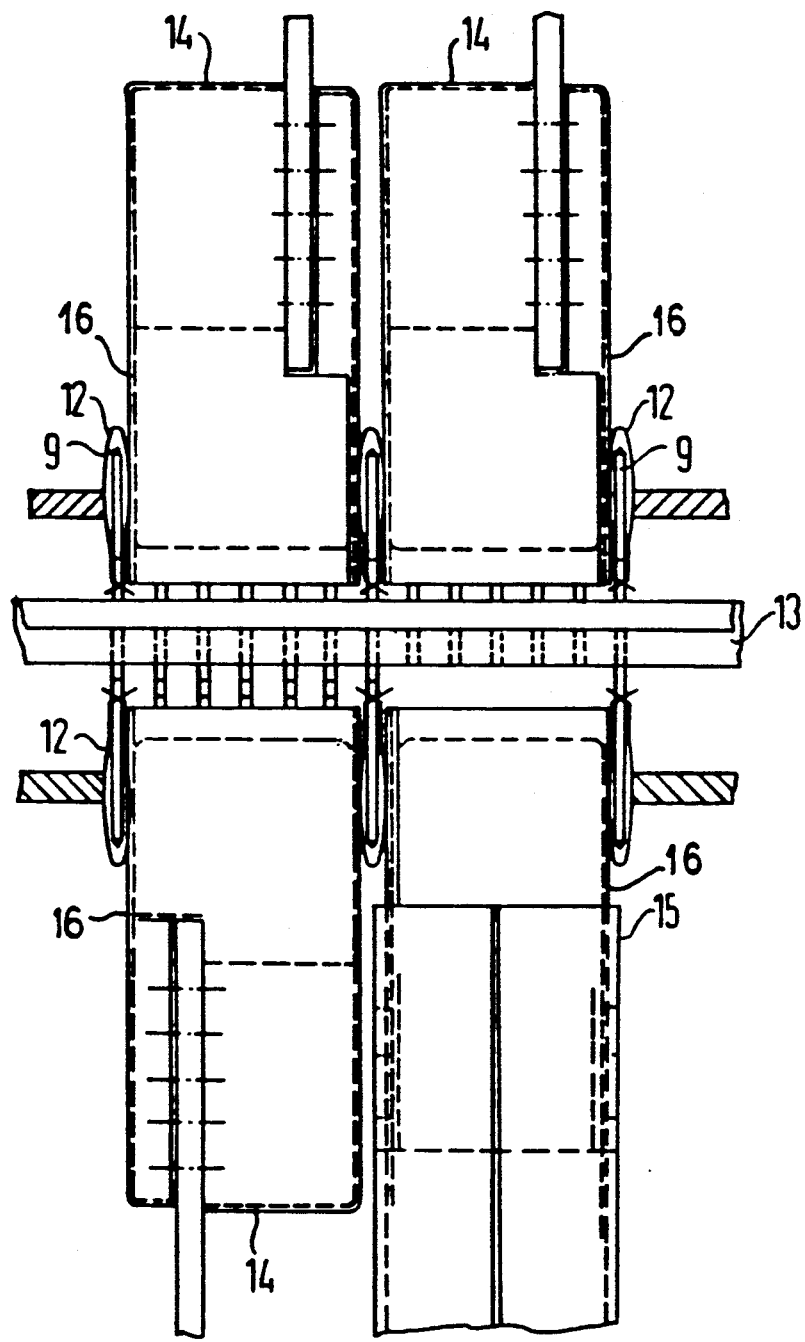

GROUNDING MECHANISM

BACKGROUND OF THE INVENTION

The present invention is directed to a grounding mechanism for the electrical connection of shieldings of multi-pole plugs to a ground potential layer of a printed circuit board that has a plurality of perpendicularly extending contact blades.

These prior art grounding mechanisms have spring elements that are arranged in combination with the shieldings such that, when the plugs are plugged onto the printed circuit board, the shieldings press resiliently against the contact blades that are conductively connected to the ground potential layer of the printed circuit board.

For example, such a grounding mechanism is disclosed by European Patent Application EP 0 203 404 A2. One disadvantage of these known grounding mechanisms is that they require a considerable manufacturing outlay and that they must be initially provided, i.e. they cannot be retrofitted as needed. A further disadvantage of the known mechanisms is that an optimum current flow to the ground potential layer is not always established.

SUMMARY OF THE INVENTION

It is an object of the present invention to provide a grounding mechanism of the type initially cited that is simple to manufacture and that can be retrofitted to existing plugs.

This object is inventively achieved for a grounding mechanism of the above-recited type in that a punched strip is provided with transverse slots and that is bent around its longitudinal axis has two edge regions. Outwardly arced spring regions that proceed parallel to the transverse slots are respectively arranged between the longitudinal axis and one of the edge regions. Webs having recesses are provided at given intervals from one another in the first edge region and clearances aligning with these recesses are provided in the second edge region. Also, the outer edge regions are bent toward one another. The punched strip is pressed together to such an extent in its integrated condition that the webs of the first edge region penetrate through the clearances of the second edge region such that the recesses together with the clearances respectively form receptacle openings for the contact blades.

The grounding mechanism of the present invention is easy to manufacture and can also be easily installed in order to connect shieldings or, respectively, shielding plates to the ground potential layer via contact blades. As a result of the continuous edge regions in the immediate proximity of the printed circuit board on which the ground potential layer is situated, an optimum current flow results as needed.

An expedient development of the grounding mechanism of the present invention is characterized in that perforations limited by a semicircle at one side are respectively arranged in the second edge region between two clearances. These perforations act as a claw and prevent the grounding mechanisms from being unintentionally pulled off when unplugging the shielded plugs from the printed circuit board.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

FIG. 4 depicts an applied example of the grounding mechanism of the present invention.

DESCRIPTION OF THE PREFERRED EMBODIMENT

Figure 1:
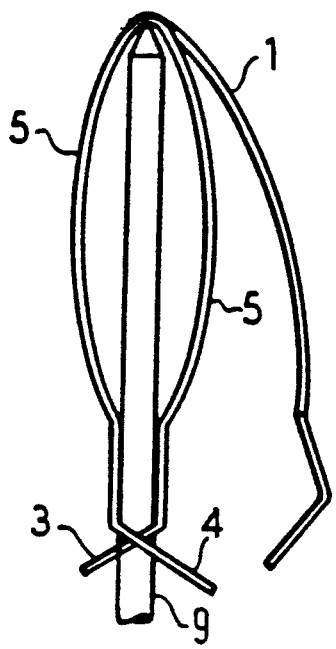
FIG. 1 is a section view through a grounding mechanism of the present invention.
Figure 3:
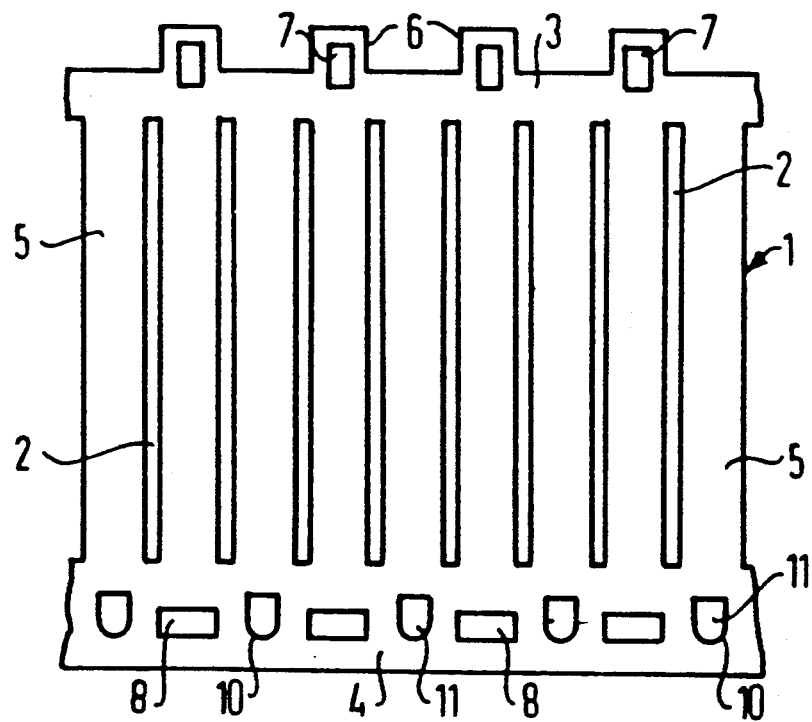
FIG. 3 is a developed view of the punched strip required for manufacturing the exemplary embodiments shown in FIG. 1 and in FIG. 2.

A punched strip 1, shown in FIG. 3, is a starting component for the grounding mechanism of the present invention. This punched strip 1 has respectively arced spring regions 5 at both sides of its longitudinal axis between transverse slots 2. These arcings of the spring regions 5 are formed such that they are directed outward in a pre-bent condition of the punched strip 1, as depicted in FIG. 1. At its sides, the punched strip 1 is limited by a first edge region 3 and by a second edge region 4.

Webs 6 are arranged at prescribed intervals in the first edge region 3. Recesses 7 that partially extend into the edge region 3 are provided within these webs 6. Clearances 8 extending in a longitudinal direction and that align with these webs 6 are provided in the opposite, second edge region 4. The outer edge regions are bent around the lines shown in FIG. 3, namely such that they point toward one another in the bent condition of the punched strip 1, as shown in the sectional view in FIG. 1.

Initially, the punched strip 1 is pre-bent to an extent as shown in FIG. 1. A certain pre-stress for achieving the final condition is produced in this way. For achieving the final condition or, respectively, the integrated condition, the outer edge regions 3, 4 of the punched strip are pressed together to such an extent that the webs 6 of the first edge region 3 are inserted through the clearances 8 of the second edge region 4. When the webs 6 are inserted through the clearances 8, then the recesses 7 of the webs 6 together with the clearances 8 form receptacle openings for contact blades 9. This allows the grounding mechanism to be slipped onto the contact blades 9 and to be held on these contact blades 9 as a result of the prestress.

Figure 2:
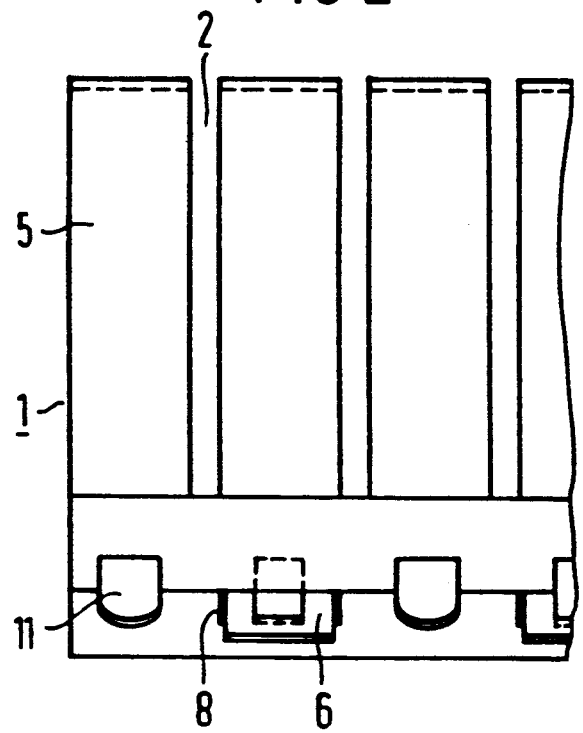
FIG. 2 is a side view of the illustrated exemplary embodiment.

The engagement of the webs 6 through the clearances 8 is depicted in FIG. 2. Due to the design conditions of the grounding mechanism of the present invention, this mechanism can be employed in arbitrary lengths.

An applied example of the grounding mechanism of the present invention is shown in FIG. 4. Plugs 14 and 15 are plugged onto a wiring back plane 13 that has contact blades 9. These plugs 14, 15 are shielded plugs that are surrounded by shielding plates 16. To the side of the plugs 14, 15, contact blades 9 are provided with the grounding mechanism 12 of the present invention via which the shielding plates 16 are connected to the ground potential layer of the printed circuit board. As a result of the continuous edge regions of the grounding mechanism of the present invention, an optimum flow of current results, as required, since the edge regions extend almost parallel to the ground potential layer.

Perforations 11 limited at one side by a semicircle 10 are arranged in the second edge region 4 between the clearances 8, and every second contact blade projects through these perforations 11 in the installed condition. These perforations 11 act as a claw and prevent the grounding mechanism from being unintentionally pulled off when the plugs are unplugged from the printed circuit board.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A grounding mechanism for the electrical connection of shieldings of multi-pole plugs to a ground potential layer of a printed circuit board having a plurality of substantially perpendicularly extending contact blades, comprising: a punched strip that is provided with transverse slots, that is bent around a longitudinal axis thereof and that has first and second edge regions, the bent punched strip having outwardly arced spring regions that proceed parallel to the transverse slots respectively between the longitudinal axis and one of the first and second edge regions, the bent punched strip having webs having recesses at prescribed intervals from one another in the first edge region and having clearances aligning with said webs in the second edge region, and the first and second edge regions being bent toward one another; the punched strip being pressed together to such an extent in the installed condition that the webs of the first edge region penetrate through the clearances of the second edge region such that the recesses together with the clearances respectively form receptacle openings for the contact blades.

2. The grounding mechanism according to claim 1, wherein the grounding mechanism further comprises perforations limited by a substantially semicircle at one side, each perforation being in the second edge region between two respective clearances.

3. A grounding mechanism for the electrical connection of a shielding of a multi-pole plug to a ground potential layer of a printed circuit board having a plurality of substantially perpendicularly extending contact blades, comprising:
a punched strip having first and second edge regions and a plurality of alternating transverse slots and spring regions, said spring regions connecting said first and second edge regions;
said first edge region having a plurality of spaced webs and a plurality of recesses, each of said webs having a respective recess;
said second edge region having a plurality of spaced clearances in alignment with said plurality of recesses in said webs;
said punched strip being bent about a longitudinal axis thereof such that said plurality of spring regions are outwardly arced and such that said clearances penetrate through said respective recesses in said webs, said first and second edge regions being bent toward one another;
wherein said recesses together with said respective clearances form receptacle openings for the contact blades of the printed circuit board; and
wherein the shielding of the multi-pole plug contacts said outwardly arced spring regions of the groundings mechanism when the multi-pole plut is plugged onto the printed circuit board.

4. The grounding mechanism according to claim 3, wherein the grounding mechanism further comprises a plurality of perforations interspeced with said plurality of clearances in said second edge region, each of said perforations having a substantially semicircular shaped area opposed from said plurality of spring regions, some of said plurality of contact blades extending through said perforations and said perforations acting as a claw to secure said grounding mechanism to said some of said plurality of contact blades.

5. A grounding mechanism for the electrical connection of a shielding of a multi-pole plug to a ground potential layer of a printed circuit board having a plurality of substantially perpendicularly extending contact blades, comprising:
a punched strip having first and second edge regions and a plurality of alternating transverse slots and spring regions, said spring regions connecting said first and second edge regions;
said first edge region having a plurality of spaced webs and a plurality of recesses, each of said webs having a respective recess;
said second edge region having a plurality of spaced clearances in alignment with said plurality of recesses in said webs;
said punched strip being bent about a longitudinal axis thereof such that said plurality of spring regions are outwardly arced and such that said clearances penetrate through said respective recesses in said webs, said first and second edge regions being bent toward one another;
a plurality of perforations interspaced with said plurality of clearances in said second edge region, each of said perforations having a substantially semicircular shaped area opposed from said plurality of spring regions, a first set of said plurality of contact blades extending through said perforations and said perforations acting as a claw to secure said grounding mechanism to said first set of said plurality of contact blades;
wherein said recesses together with said respective clearances form receptacle openings for a second set of said plurality of contact blades of the printed circuit board; and
wherein the shielding of the multi-pole plug contacts said outwardly arced spring region of the grounding mechanism when the multi-pole is plugged onto the printed circuit board.

* * * * *